US010707996B2

(12) United States Patent
Wu

(10) Patent No.: US 10,707,996 B2
(45) Date of Patent: Jul. 7, 2020

(54) ERROR CORRECTING CODES WITH BAYES DECODER AND OPTIMIZED CODEBOOK

(71) Applicant: International Business Machines Corporation, Armonk, NY (US)

(72) Inventor: Chai W. Wu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 15/947,628

(22) Filed: Apr. 6, 2018

(65) Prior Publication Data

US 2019/0312666 A1    Oct. 10, 2019

(51) Int. Cl.
*H04L 1/00* (2006.01)
*G06N 7/00* (2006.01)
*H03M 13/11* (2006.01)

(52) U.S. Cl.
CPC ............. *H04L 1/007* (2013.01); *G06N 7/005* (2013.01); *H03M 13/1111* (2013.01)

(58) Field of Classification Search
CPC ..... H04L 1/007; H03M 13/1111; G06N 7/005
See application file for complete search history.

(56) References Cited

U.S. PATENT DOCUMENTS

| 6,654,926 | B1 | 11/2003 | Raphaeli et al. |
| 6,990,626 | B2 | 1/2006 | Ashikhmin |
| 8,301,963 | B2 | 10/2012 | Hou et al. |
| 8,358,685 | B2 | 1/2013 | Siti et al. |
| 8,548,027 | B2 | 10/2013 | Zeng et al. |
| 2009/0245083 | A1* | 10/2009 | Hamzeh ............... H03M 13/356 370/204 |

(Continued)

FOREIGN PATENT DOCUMENTS

WO    WO2004084417 A1    9/2004

OTHER PUBLICATIONS

Berger, "Error-Correcting Output Coding for Text Classification", IJCAI Workshop: Machine Learning for Information Filtering, Aug. 1, 1999, Stockholm, Sweden, 8 pages.

(Continued)

*Primary Examiner* — Guy J Lamarre
(74) *Attorney, Agent, or Firm* — Scully, Scott, Murphy & Presser, P.C.; Daniel Morris, Esq.

(57) ABSTRACT

A framework for error correction coding that takes into account the difference in bit significance in the source symbols by using an appropriate error metric and minimizing it using a Bayes decoder and an optimized codebook. The Bayes decoder performs better than standard soft and hard minimum distance decoding and the optimized codebook performs better than classical linear block codes, e.g., Hamming codes. The error metric is a norm in information symbol space and is based on a loss function appropriately defined according to an approach for assigning significance to the various bits in the source bit stream. The Bayes decoder of this metric is defined and an optimized codebook generated that optimizes this metric under a noisy channel. The framework for error correction coding is implemented for increased reduncancy in a communications system or a data storage system and is optimized to combat noise in such systems.

20 Claims, 9 Drawing Sheets

(56) References Cited

U.S. PATENT DOCUMENTS

2013/0300591 A1* 11/2013 Marpe .................... H03M 7/46
                                                                           341/67
2018/0018590 A1* 1/2018 Szeto .................... G06N 20/00

OTHER PUBLICATIONS

Russell et al., "Artificial Intelligence a Modern Approach", Second Edition, Pearson Eduction, Inc., Upper Saddle River, New Jersey 07458, Book, 2003, Chapter 4, pp. 111-114.

* cited by examiner $$\begin{pmatrix} \overset{510A}{0} & \overset{510B}{0} & 0 & 0 & 0 & 0 & 0 & 1 & 1 & 1 & 1 & 1 & 0 & 1 & 1 & \overset{510P}{1} \\ 1 & 1 & 0 & 0 & 0 & 1 & 1 & 1 & 1 & 1 & 1 & 0 & 0 & 0 & 0 & 0 \\ 1 & 0 & 0 & 0 & 0 & 0 & 0 & 0 & 0 & 1 & 1 & 1 & 1 & 1 & 1 & 1 \\ 0 & 0 & 0 & 0 & 1 & 1 & 1 & 1 & 1 & 1 & 1 & 1 & 1 & 1 & 0 & 0 \\ 0 & 0 & 0 & 0 & 0 & 0 & 1 & 1 & 1 & 0 & 0 & 1 & 1 & 1 & 1 & 1 \\ 0 & 0 & 0 & 0 & 0 & 1 & 1 & 0 & 0 & 0 & 1 & 1 & 1 & 1 & 1 & 1 \\ 0 & 0 & 0 & 1 & 0 & 0 & 0 & 0 & 1 & 1 & 1 & 1 & 1 & 1 & 1 & 0 \end{pmatrix}$$
$\underbrace{\qquad\qquad\qquad\qquad\qquad}_{510}$ 500

FIG. 5

$$\begin{pmatrix} 0 & 0 & 1 & 0 & 1 & 1 & 1 & 1 & 1 & 1 & 1 & 1 & 1 & 1 & 0 & 0 \\ 0 & 0 & 0 & 0 & 0 & 0 & 0 & 0 & 1 & 1 & 1 & 1 & 1 & 1 & 1 & 1 \\ 1 & 1 & 1 & 1 & 1 & 1 & 1 & 0 & 1 & 0 & 0 & 0 & 0 & 0 & 0 & 0 \\ 0 & 0 & 0 & 0 & 0 & 0 & 1 & 0 & 0 & 0 & 1 & 1 & 1 & 1 & 1 & 1 \\ 1 & 0 & 1 & 1 & 0 & 0 & 0 & 0 & 0 & 0 & 0 & 0 & 1 & 1 & 0 & 1 \\ 1 & 1 & 1 & 1 & 1 & 1 & 1 & 1 & 0 & 0 & 0 & 0 & 0 & 0 & 0 & 0 \\ 1 & 1 & 1 & 0 & 1 & 0 & 0 & 0 & 0 & 1 & 1 & 0 & 1 & 0 & 0 & 0 \end{pmatrix}$$
600

FIG. 6

$$\begin{pmatrix}
0 & 0 & 0 & 1 & 0 & 1 & 1 & 1 & 1 & 0 & 1 & 0 & 0 & 0 & 0 & 0 \\
0 & 0 & 0 & 0 & 1 & 1 & 1 & 1 & 1 & 1 & 0 & 0 & 0 & 0 & 0 & 0 \\
0 & 0 & 0 & 0 & 0 & 0 & 0 & 1 & 1 & 1 & 1 & 1 & 1 & 0 & 0 & 0 \\
1 & 0 & 1 & 1 & 1 & 0 & 1 & 1 & 0 & 0 & 0 & 0 & 1 & 0 & 1 & 1 \\
0 & 1 & 1 & 1 & 1 & 1 & 1 & 1 & 0 & 0 & 0 & 0 & 0 & 0 & 0 & 1 \\
1 & 1 & 1 & 1 & 1 & 1 & 1 & 1 & 0 & 0 & 0 & 0 & 0 & 0 & 0 & 0 \\
1 & 1 & 1 & 1 & 1 & 1 & 1 & 1 & 0 & 0 & 0 & 0 & 0 & 0 & 0 & 0
\end{pmatrix}$$

ERROR CORRECTING CODES WITH BAYES DECODER AND OPTIMIZED CODEBOOK

FIELD

The present disclosure generally relates to error correction in communication systems, and particularly to an Error Correction Coding (ECC) scheme that implements Bayes estimators with general loss functions to take into account a bit significance.

BACKGROUND

The information bit error rate (BER) in classical error coding is based on the Hamming distance, i.e. the number of bits that are different between the symbols at the transmitter and the decoded symbols at the receiver. For this metric, the positions of the source bits where the error occurred are not significant. This is unsatisfactory since in many scenarios all source bits are not equal and have different significance. For instance, representing an integer in binary, the bits will have different significance with the difference increasing exponentially with its position, and an error in the most significant bit is much more problematic than an error in the least significant bit.

Furthermore, the relationship between the difference $|i-j|$ of two integers i and j and the Hamming distance when expressed as bitstrings is nonlinear and nonmonotonic. For instance, the difference between the numbers 8 and 7 is 1, but expressed as bits, their Hamming distance is 4. On the other hand, the difference between 0 and $2^k$ is $2^k$, but have a Hamming distance of 1. In image compression, the discrete cosine transform (DCT) coefficients for lower frequencies are more important than the higher frequencies coefficients and luminance coefficients are more important than chrominance coefficients as the human visual system exhibits low-pass behavior and is more sensitive to luminance changes. In stored program computers, the program code is more critical than data as an erroneous instruction can cause the machine to crash whereas incorrect data typically leads to incorrect results, but not cause a machine to crash.

BRIEF SUMMARY

A system and method for Error Correction Coding (ECC) scheme for a communication system that transmits symbols containing bits over a communications channel and which encoding scheme takes into account the difference in significance of the source bits.

A system and method for Error Correction Coding (ECC) scheme for a data storage system that stores symbols containing bits for storage and which encoding scheme takes into account the difference in significance of the source bits.

In one embodiment, the error metric measures the distance in the symbol space, e.g., for 2 symbols i, j expressed as integers, the distance can be $(i-j)^2$ or $|i-j|$.

According to one aspect of the invention, there is provided an error correction method in a data symbol communication system. the error correction method comprises: receiving a signal at a decoder device, the signal representing an encoded source symbol having source bits; decoding, at the decoding device, the encoded source symbol to obtain a decoded source symbol, and mapping the decoded source symbol to a corresponding source symbol, the encoded source symbol based on an encoding of the source symbol having bits that account for differences in significance of the bits.

According to a further aspect of the invention, there is provided a system for correcting error corrected encoded signals. The system comprises: a decoder device for receiving a signal, the signal representing an encoded source symbol having source bits, the decoder processing the received signal to obtain a decoded source symbol; a mapping device for mapping the decoded source symbol to a corresponding source symbol, the encoded source symbol encoded based on an encoding of source symbol having bits that account for differences in significance of the bits.

In a further aspect, a data storage system is provided for storing encoded symbols. The data storage system comprises a memory for receiving and storing encoded source symbols at memory locations, the encoded source symbols based on an encoding of symbol source having bits that account for differences in significance of the bits.

BRIEF DESCRIPTION OF THE SEVERAL VIEWS OF THE DRAWINGS

Objects, features, and advantages of the present disclosure will become more clearly apparent when the following description is taken in conjunction with the accompanying drawings, in which:

FIG. 5 is an example of a rate 4/7 block optimized codebook corresponding to a first error metric according to an embodiment of the present disclosure;

FIG. 6 is an example of a rate 4/7 block optimized codebook corresponding to a second error metric according to an embodiment of the present disclosure;

FIG. 8 shows an example optimized codebook 800 for error metric $e_{\delta_2}$ for the case k=4, rate 4/7, where the first, 8-th, 9-th, and last column corresponds to s=0, s=7, s=−8, and s=−1, respectively source symbols are represented in 2's complement format in a further embodiment;

DETAILED DESCRIPTION

The present disclosure relates to devices and methods employing an Error Correction Coding (ECC) scheme for a communication system that communicates data symbols over a communications channel and which applies an ECC encoding scheme to source bits that takes into account the difference in significance of the source bits.

Additionally, the present disclosure relates to devices and methods employing an Error Correction Coding (ECC) scheme for a data storage system that receives and stores data symbols having source bits encoded according to an ECC encoding scheme that takes into account the difference in significance of the source bits.

ECC symbol encoder/decoder circuitry, memory devices, and data methods are described that facilitate the detection and correction of data in both communication systems and memory systems and devices (e.g., memory controllers, memory systems, and/or non-volatile memory devices) and which ECC symbol encoder circuitry applies an ECC encoding scheme to source bits to be communicated over a channel or stored in a memory device that takes into account the difference in significance of the source bits.

Figure 1:
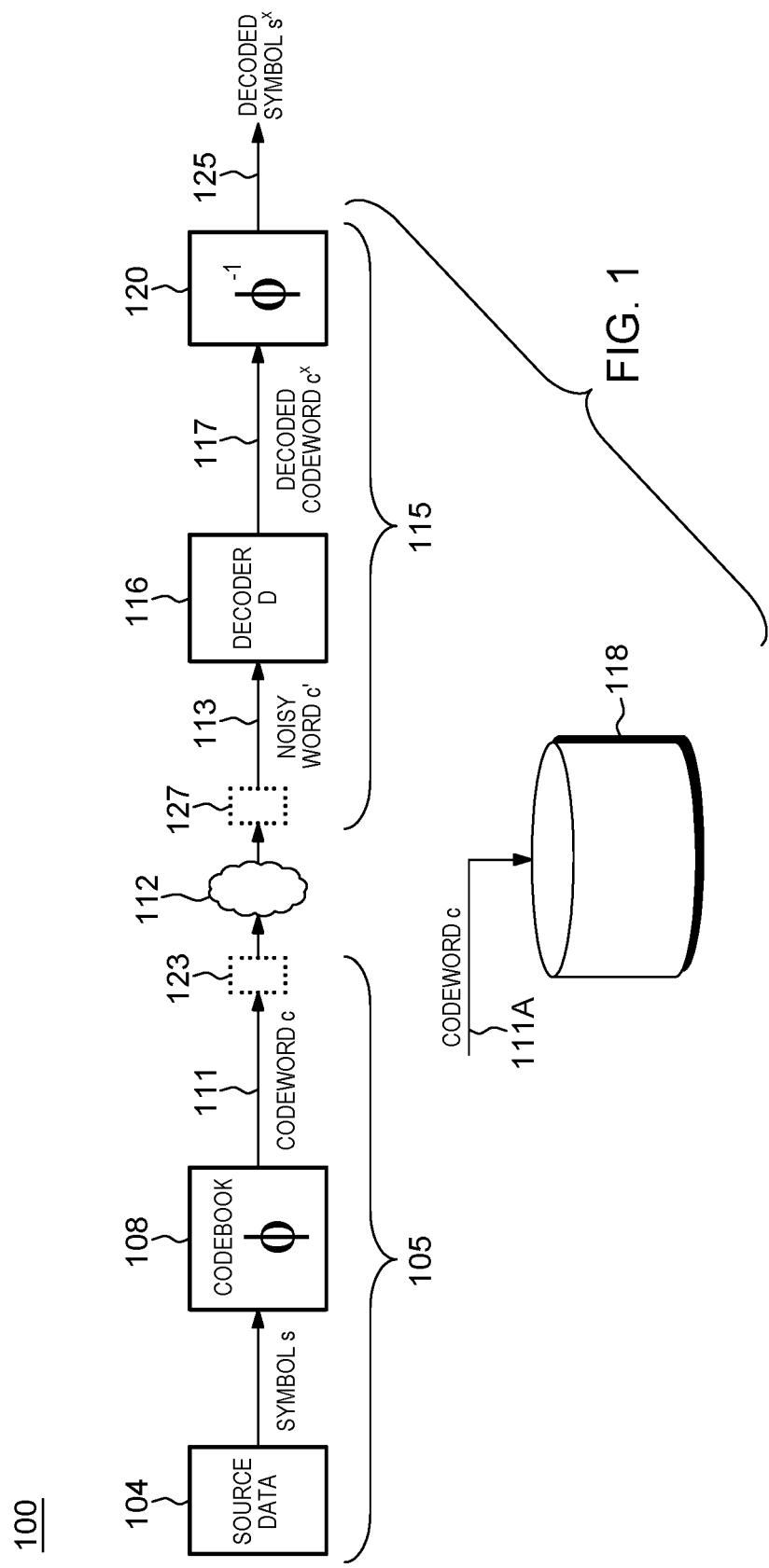
FIG. 1 is schematic view of an exemplary communications system in which embodiments of the present invention may be employed.

FIG. 1 details a simplified diagram of an exemplary communications system 100 in which an embodiment of the present invention may be employed. In accordance with the embodiment depicted, the system 100 is a data communications system that includes a device 105, e.g., a transmitter, router, having an encoder device that runs an error correction encoding application to encode source data, e.g., a source symbol 104 having bits, according to using an optimized codebook 108 having corresponding codes configured to take into account the difference in significance of source data bits.

In FIG. 1, memory devices, control circuitry, and/or data handling routines apply the ECC encoding techniques to the source symbol in a manner that facilitates the detection and correction of the source data in communication systems, memory systems or devices. In operation, based on the source symbol to be transmitted (or stored), control circuitry at the transmitter 105 selects a corresponding codeword from the codebook 108 to encode source symbol "s" resulting in a codeword "c" 111. In one embodiment, this codeword c 111 may be further modulated by a signal modulator 123 according to an analog or digital modulation scheme prior to transmission over a wired or wireless communications channel 112.

In further embodiments, the encoding scheme depicted in FIG. 1, may be used to encode source data (e.g., symbol "s") prior to their storage in a memory device 118 as ECC data encoded according to the methods described herein. Thus, encoded symbol codewords c 111A may be optionally modulated and directly stored in a memory storage device 118.

According to the embodiments herein, the codebook 108 implements an ECC encoder based on an encoding scheme that optimizes an error metric e(s) such that the codeword (after transmitting through the channel or stored in a memory storage device) become optimally decoded using a corresponding ECC decoder and inverse codebook. According to the invention, an error metric is a measure of the distance in the source (or information) symbol space, e.g., for 2 symbols i, j expressed as integers, the distance can be $(i-j)^2$ or $|i-j|$. In an implementation, an optimal decoder embodied as a Bayes estimator (from estimation theory) uses the error metric in symbol space as a "Loss" function.

Further, heuristics are used to find codebook codewords that optimizes error metric e(s). In one embodiment, a genetic algorithm is used to find an optimized codebook based on an objective function that incorporate the error metric e(s) and a characteristic of the channel (communications channel over which the encoded bits are transmitted). A penalty function is added to the objective function to ensure all codewords are distinct.

In anther embodiment, hill climbing or variants such as stochastic hill climbing or hill climbing with random restarts are used to optimize the objective function with optional penalty function in order to find the optimized codebook.

In the following description of the error correction encoding application, an integer is denoted as a value n where $0 \leq n < 2^k$, and for an integer $0 \leq n < 2^k$, $b_k(n)$ denotes the k-bit representation of n, e.g., $b_4(9)=1001$. The bijection between symbols $s \in S$ (representing information or source symbols) and codewords $c \in C$ is denoted by $\Phi$. Each symbol in S is assumed to occur with equal probability in the data stream, i.e. $\forall s \in S$, $$p(s) = \frac{1}{|S|}.$$

With reference to the communications system 100 of FIG. 1, data circuits encode source data bits of each symbol s by mapping the symbol to a corresponding codeword $c = \Phi(s)$ according to a codebook 108 (hereinafter "$\Phi$") of codewords prior to transmitting the encoded symbol through the channel 112 or prior to storing the encoded symbol in a memory storage. The act of a moving a codeword through the channel (through space for communication systems and through time for storage systems) may incur errors because of the noise characteristic of the channel.

Further, with reference to FIG. 1, the modulated ECC encoded data symbol is received at a communications receiver 115. At the receiver, the received modulated encoded signals may first be demodulated by a corresponding signal demodulator 127 to obtain a noisy word c' 113 which is then decoded at a decoder device 116 as $D(c') = c^* \in C$. Then the decoded symbol 117 is retrieved as $s^* = \Phi^{-1}(c^*)$ by applying inverse codebook 120 (hereinafter "$\Phi^{-1}$"). In one embodiment, if the noise is small enough, the inverse codebook 120 maps the decoded noisy ECC encoded word to the original source data.

In a further embodiment, the decoded symbol $s^* = \Phi^{-1}(c^*)$ can be retrieved efficiently by implementing a hash table to facilitate the inverse codebook lookup. For example, a hash table and a constructed dictionary indexed by the decoded codewords can be used to map the decoded codeword 117 to the corresponding source symbols.

Given a transmitted codeword c 111 and a received word c' 113 (that may or may not be a codeword in C), the ideal observer decoding returns the codeword c* such that $c^* = \text{argmax}_{w \in C} p(w|c')$ where $p(w|c')$ is the probability that codeword w is sent given that c' is received. Given the assumption of a uniform prior distribution for codewords c, this is equivalent to maximum likelihood decoding. For certain channel models (e.g. binary symmetric channel with p<0.5), this is equivalent to minimum distance decoding.

To take into account the difference in significance of the bits of the source symbols, instead of bit error rate (BER), an error metric is used that measures the difference between source symbols. The following error rate $e_\delta$ is considered:

$$e_\delta = \frac{1}{N} \sum_{i=1}^{N} \delta(s(i), s^*(i))$$

where s(i) is the i-th (transmitted) source symbol and s*(i) is the i-th decoded symbol. The function δ measures the difference between the transmitted symbol and the decoded symbol. In an example of comparing integers, the following two functions are defined:

$$\delta_1 = |b_k^{-1}(s) - b_k^{-1}(s^*)| \text{ and}$$

$$\delta_2 = (b_k^{-1}(s) - b_k^{-1}(s^*))^2$$

These represent the difference (resp. squared difference) between s and s* when expressed as integers.

In order to minimize this error rate, there is optimized 1) the decoding method D; and 2) the codebook $\Phi$.

In one embodiment, the minimizing of the error rate include applying a Bayes estimator that returns the decoded symbol s*, or equivalently the decoded codeword c*=$\Phi$(s*), that minimizes the expected loss E(L(s*,s)|c'), where L(s*,s) is a loss function measuring the difference between the decoded symbol s* and the transmitted symbol s. In one aspect, the loss function can take into account the different significance of the source or information bits. Consider the posterior distribution p(s|c') For an additive white Gaussian noise (AWGN) channel, p(s|c') is proportional to $g_{(\mu,\sigma)}(c'-\Phi(s))$ where g is the multivariate Gaussian pdf with mean $\mu$ and variance $\sigma^{-2}$. Typically, the mean $\mu$ is 0. For a general loss function on a finite discrete symbol space, the Bayes estimator can be implemented by comparing all possible codebook candidates to the received codeword. For the case when s is a scalar quantity and for some special forms of the loss function, the following explicit forms of the Bayes estimator can be used:

In one embodiment, the loss function is the 0-1 loss function, i.e. L(s*,s)=0 if s*=s and 1 otherwise. If the loss function is the 0-1 loss function, then the Bayes estimator is the mode of the posterior distribution and is equivalent to the maximum-a-posteriori estimate or the ideal observer.

In one embodiment, the loss function is the squared error loss function, i.e. L(s*,s)=(s*−s)². If the loss function is the squared error loss function, then the Bayes estimator is the mean of the posterior distribution.

In one embodiment, the loss function is the absolute value loss function, i.e. L(s*,s)=|s*−s|. If the loss function is the absolute value loss function, then the Bayes estimator is the median of the posterior distribution.

In one embodiment, the loss function is a function L that explicitly weights the bits according to their significance described as follows: assuming that x and y are integers and letting $a_i(x)$ and $a_i(y)$ denote the i-th bit of x and y respectively, with the 0-th bit being the least significant bit. Then the loss function is:

$$L(x, y) = \sum_i \alpha_i |a_i(x) - a_i(y)|$$

One choice of the coefficients $\alpha_i$ are: $\alpha_i = 2^i$. For these coefficients, L(x,y) is equal to the integer value of the bitwise XOR of x and y.

The Bayes risk is defined as $E_\pi(L(s^*,s))$, where $\pi$ is the prior distribution of s and the Bayes estimator is the estimator that minimizes the Bayes risk. Since $\pi$ is the uniform distribution by the assumption, $$\frac{1}{N} \sum_i L(s^*(i), s(i))$$

is an unbiased estimator of the Bayes risk. Thus the Bayes estimator is the appropriate choice in order to minimize $$\frac{1}{N} \sum_i L(s^*(i), s(i)),$$

which is equal to error rate $e_\delta$ if $$L(s^*,s) = \delta(s,s^*) \quad (1)$$

This analysis shows that the loss function is selected according to Eq. (1).

Having determined the optimal decoding scheme for a specific form of $e_\delta$ and a specific codebook, the next step is to find an optimal codebook $\Phi$ that minimizes $e_\delta$ among all codebooks. In one embodiment, the following heuristic is used. In particular, there is found a codebook 108 that minimizes:

$$v = \Sigma_{i \neq j} \delta(s_i, s_j) p_c(\Phi(s_i) | (\Phi(s_j))$$

where $p_c(x|y)$ for x, y$\in$C is the probability of receiving codeword x when codeword y is transmitted. For the AWGN channel with zero mean and variance $\sigma^2$, $p_c(x|y)$ is proportional to $$e^{-\frac{d_H(x,y)}{2\sigma^2}}$$

where $d_H$ is the Hamming distance. Thus, there is obtained an objective function:

$$v = \sum_{i \neq j} \delta(s_i, s_j) e^{\frac{-d_H(\Phi(s_i), \Phi(s_j))}{2\sigma^2}}$$

wherein $\delta(s_i, s_j)$ is a difference (loss) function and $s_i$ and $s_j$ are the codewords to be constructed for columns i and j and of the optimized codebook. In one embodiment, a genetic algorithm may be used to find codebooks that minimizes the objective function v. To ensure the codewords are distinct, there is added a penalty term to the objective function whenever a candidate codebook satisfies $d_H(\Phi(s_i), \Phi(s_j)) = 0$ for some i$\neq$j. Note that the optimal notebook depends on the error function $e_\delta$ and the channel probability $p_c$. In a preferred embodiment, after adding the penalty function, the objective function is of the form $$v = \sum_{i \neq j} \delta(s_i, s_j) e^{\frac{-g(d_H(\Phi(s_i), \Phi(s_j)))}{2\sigma^2}}$$

where g(x)=−w if x=0 and g(x)=x otherwise. The value of w is chosen to be a large number. In a preferred embodiment, w=2 k.

Figure 2:
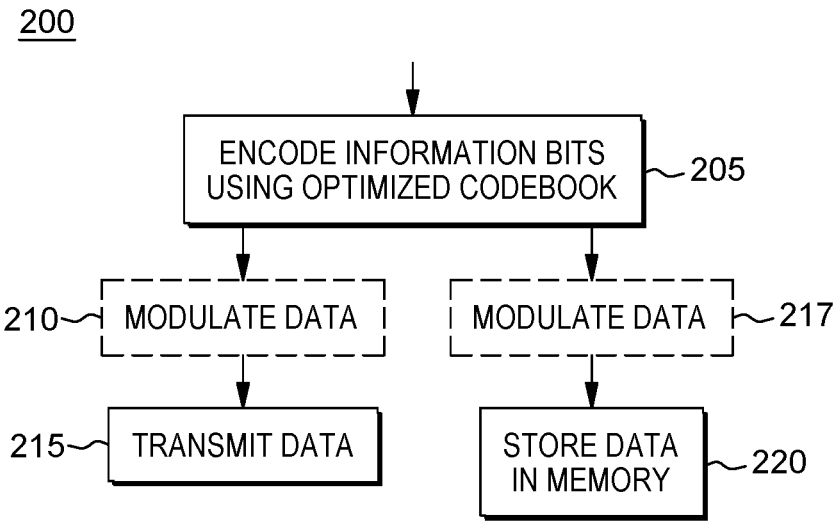
FIG. 2 depicts a method employed for encoding symbols in a communications system or data storage system according to one embodiment.

FIG. 2 shows a method 200 employed at a transmitter device 105 of a communication system according to one embodiment, or as data logic employed by a memory controller at a memory storage device according to another embodiment. As shown at 205, the encoding circuitry encodes information bits of source data using the optimized codebook 108 having codewords that take into account the difference in significance of the bits of the source symbols. For example, an example codebook shown in FIG. 5 shows a matrix 500 of codewords, i.e., columns 510, each column corresponding to a respective ECC codeword. In one embodiment, the encoder device applies a mapping of a source symbol (bits) to an ECC code (bits) column according to the optimized ECC codebook 108. The codebook 500 is optimized to ensure that a difference between ECC codes in adjacent or nearby columns, e.g., codewords at columns 510A, 510B, is less than a difference between codes in further apart columns of the matrix, e.g., codewords at columns 510B and 510P. In one embodiment, block code methods may be implemented to take source symbols (e.g., from a source alphabet) and map them to a sparse subset of channel code alphabet. For example, "n" source symbol bits are encoded into "m" bits where m>n, i.e., only a subset of m-bit binary strings are codewords. When implemented in a communication system, at 210, the encoded data symbol 111 represented by a codeword may be first modulated by a signal modulator prior to transmission over a communications channel. The signal modulator may apply a conventional analog or digital modulation technique allowing the codeword to be communicated at 215 as an encoded data stream over a wired and/or wireless communications channel 112. In an alternative embodiment, the codeword may be optionally modulated 217 and directly stored in a data storage system as encoded symbols.

Figure 3:
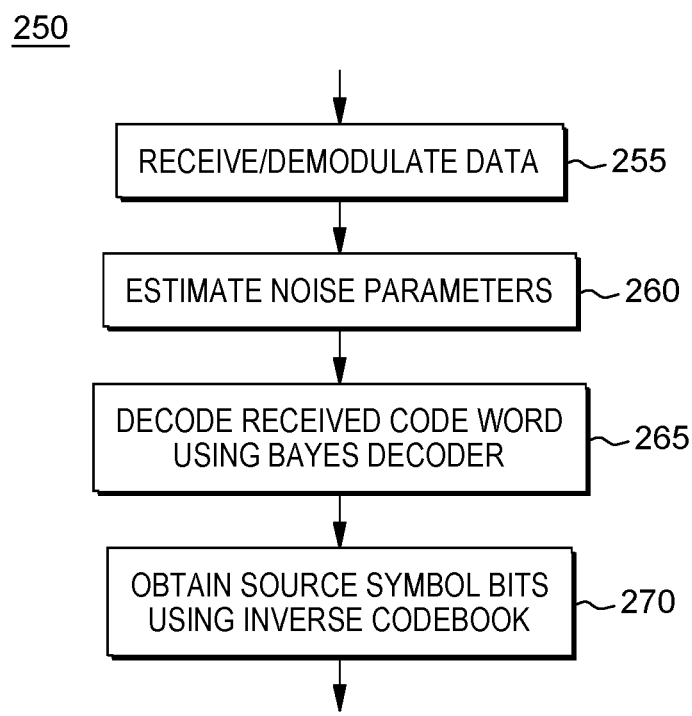
FIG. 3 depicts a method employed for decoding symbols encoded according to the embodiments of the invention.

FIG. 3 shows a method 250 employed at a receiver device 115 of a communication system according to one embodiment. As shown at 255, the receiver receives and demodulates using a demodulator device, the ECC encoded symbol (codeword) received from the channel which corresponds to codewords that take into account the difference in significance of the bits of the source symbols. The signal demodulator may apply a conventional analog or digital signal demodulation technique. Further, noise models and noise parameters of the channel may be estimated at step 260. That is, as the communications channel is a noisy channel, the optimized codebook is generated that optimizes the error metric under the noisy channel, i.e., codewords of the codebook are generated to optimize the error metric under a channel noise characteristic. The error metric is a norm in information symbol (source symbol) space whereas the noisy channel is defined on the space of codewords. Then, at 265, the decoding of corrupted codewords thus use Bayes decoding which requires an estimation of the channel noise. In the case of AWGN, the variance of the noise can be estimated from the variance of the codewords and the variance of the received codeword bits. The Bayes decoder is then applied for decoding the received noisy demodulated encoded symbol to obtain decoded codeword c* 117 which is one of the columns in an inverse codebook 120. Then, once the decoded codeword is obtained, the inverse codebook 120 is employed at 270 (FIG. 2) to uniquely map the decoded codeword to a matrix column of the inverse codebook to obtain the source symbol, e.g., transmitted or stored information symbol (bits) 125 according to the optimized inverse ECC codebook 120.

In further embodiments, it is understood that different codebooks can be used (and the codebook choice communicated between the transmitter and the receiver) based on the noise models and/or parameters. That is, based on possible types of noise models and parameters that are likely to be encountered in the communication channel and the error metric of interest, a set of codebooks and Bayes decoder are optimized off-line for different types of noise models and parameters. During implementation of the transmission system, the noise models and parameters of the transmission channel are estimated and the codebook and Bayes decoders whose corresponding noise model and parameters matches the best with the estimated parameters will be chosen. The choice of codebook and Bayes decoder may change as noise conditions change over time, and such choice of codebook and decoder need to be communicated to the receiver and the inverse codebook need to be matched to the codebook in the transmitter.

This ECC encoding and decoding framework illustrated in FIGS. 2 and 3 can be superior to classical linear block codes such as Hamming codes and decoding methods such as minimum distance decoding as illustrated by comparison with some well known linear block codes and decoding methods.

Block Code of Rate 4/7

For a (n,k) block code, consider an example case n=7, k=4. Letting the $16=2^4$ symbols be 0, 1, . . . , 15 and each symbol is mapped to a length 7 binary string, there is constructed an optimized codebook assuming an AWGN channel with σ=1. Simulating the performance of this codebook and that of the Hamming (7,4) code, there is considered three decoding schemes:

1. Hard decoding: the received signal is quantized and the decoded codeword is the closest codeword with respect to the Hamming distance.

2. Soft decoding: the decoded codeword is the nearest codeword with respect to the Euclidean distance.

3. Bayes decoding, as described above.

For an AWGN channel the received noisy word is c'=c+noise and the Bayes estimator requires knowing (or estimating) the variance of the noise. With the assumption that the codewords are equiprobable, the variance of the codewords bits are computed as the variance of the bits of codebook Φ. Since the noise is uncorrelated with the codewords, the variance of the noise can be estimated by subtracting the variance of the codewords bits from the estimated variance of the received noisy bits.

Considering both error metrics $e_{\delta_1}$ and $e_{\delta_2}$ (corresponding to two different loss functions), the Bayes estimator is simply the median and mean of the posterior distribution in the symbol space S respectively. Furthermore, the codebook used is optimized by minimizing v using a genetic algorithm for $e_{\delta_1}$. A different codebook is constructed if v is optimized with respect to $e_{\delta_2}$. In particular, for metric $e_{\delta_1}$, the optimized codebook is shown in FIG. 5 which shows an example of a rate 4/7 block optimized codebook 500 comprising a matrix of codewords found by using a genetic algorithm for minimizing an objective function. In codebook 500, each of columns 510 is a codeword and the first codeword 510A corresponds to source symbol 0 and the last codeword 510P corresponds to source symbol 15. Because of the additive white noise assumption, permuting the rows of this codebook will not affect the error rate. On the other hand, permuting the columns of the codebook will affect the error rate. As the error metric measures the difference between symbols as integers, the Hamming distance of the codewords are correlated with the difference of the symbols as integers, not as bitstrings (e.g., recall that 7 and 8 differ by 1 as integers but has a Hamming distance of 4 as bitstrings). In this codebook the Hamming distance between the codewords for 7 and 8 is 1. Similarly, 8 and 0 differ by 8 as integers but have a Hamming distance of 1 as bitstrings. In the codebook, the codewords for 0 and 8 have a Hamming distance of 5.

Figure 4:
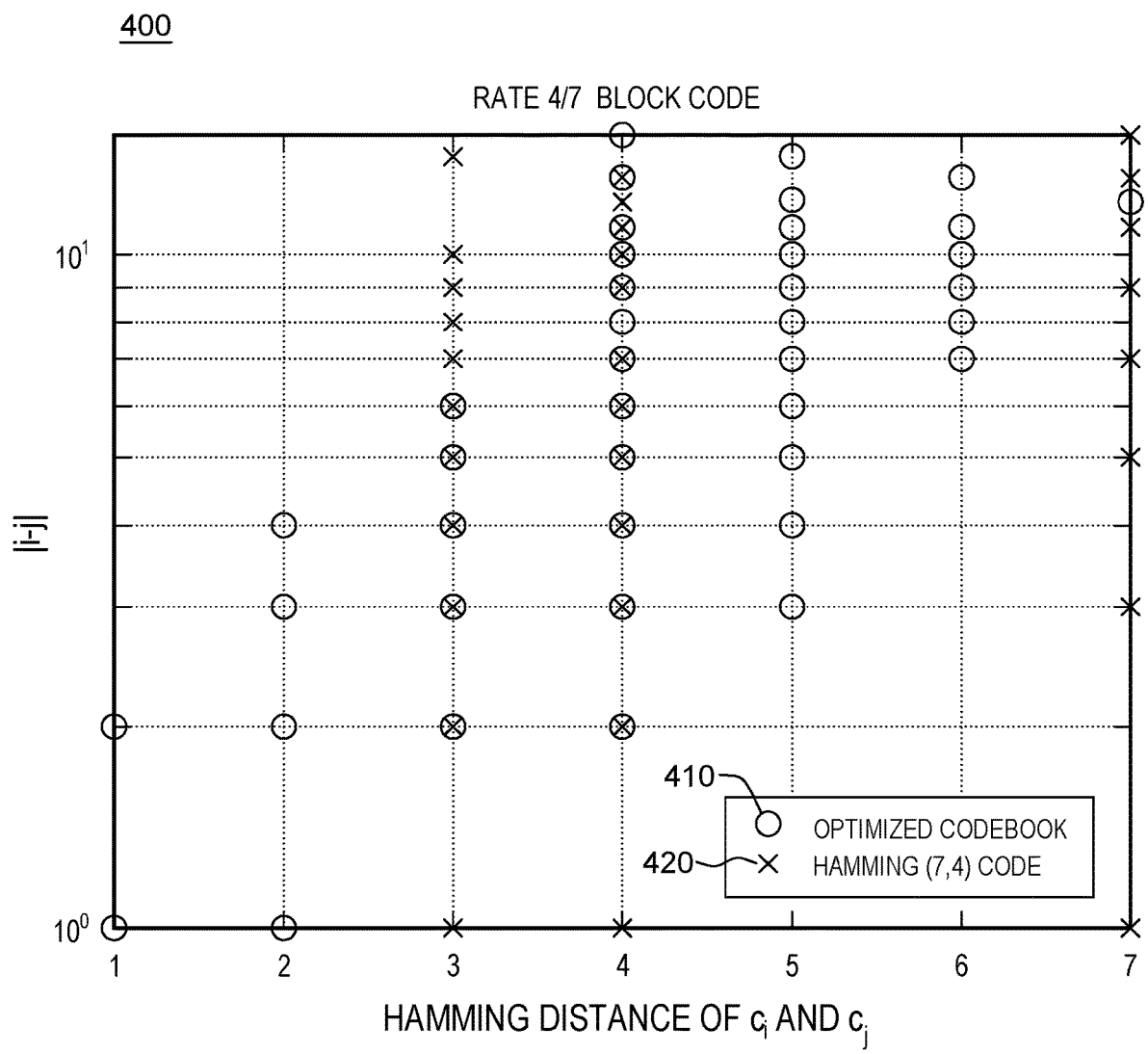
FIG. 4 depicts a plot 300 of the Hamming distance of the codewords $c_i$ and $c_j$ for i and j versus $|i-j|$.

This is further illustrated in FIG. 4 which depicts a plot 400 of the Hamming distance of the codewords $c_i$ and $c_j$ for i and j versus |i−j|. In FIG. 4, for each pair of codewords $c_i$ and $c_j$ with i not equal to j, a point $(d_H(c_i,c_j),|i-j|)$ is plotted.

Ideally, a linear relationship between the Hamming distance of the codewords for i and j and log |i−j| is desirable and it is seen that the optimized codebook code 410 does a much better job at satisfying this requirement than the Hamming (7,4) code 420 whose codewords only have a pairwise Hamming distance of 3, 4 or 7.

FIG. 6 depicts one example embodiment of an optimized codebook 600 for metric $e_{\delta_2}$.

Figure 7A:
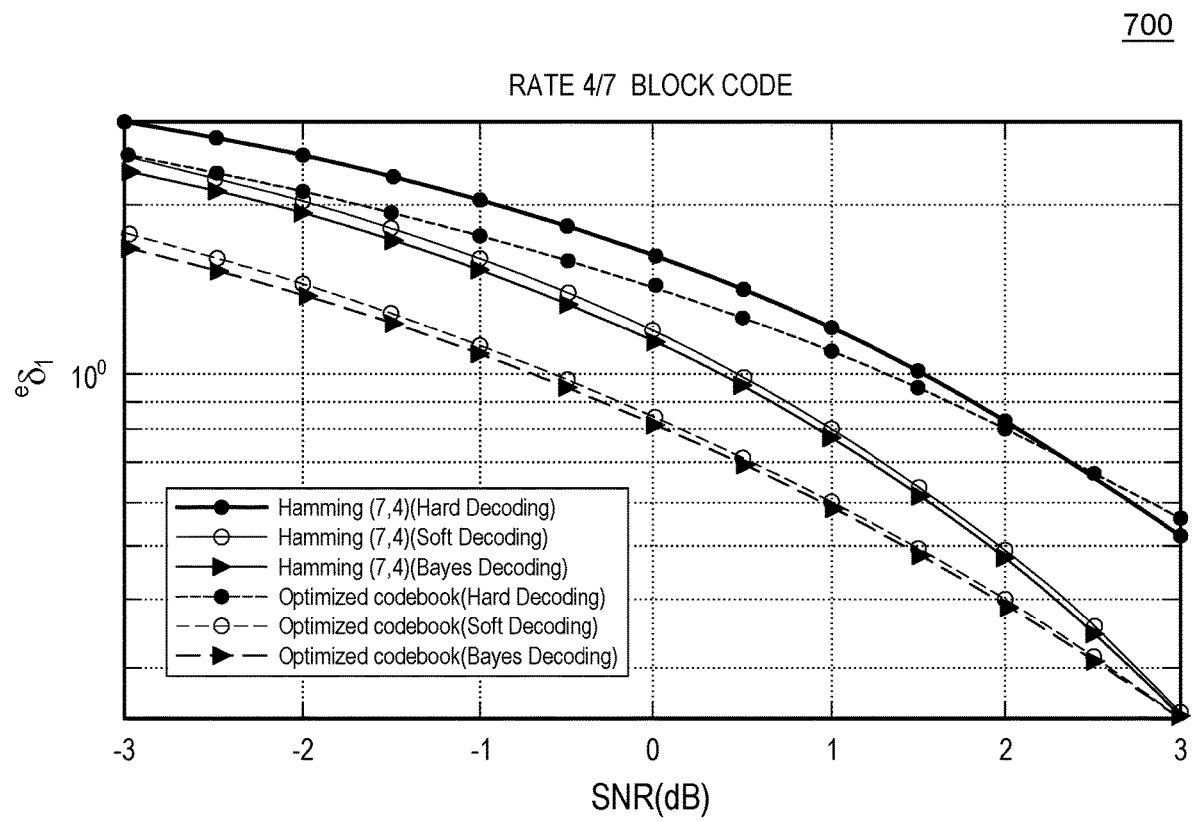
FIGS. 7A and 7B depicts simulation results of a system using the respective optimized codebook and Bayes decoder optimized for SNR=0 db corresponding to respective error metrics $e_{\delta_1}$ (FIG. 7A) and $e_{\delta_2}$ (FIG. 7B) as compared to respective use of Hamming (7,4) code.
Figure 7B:
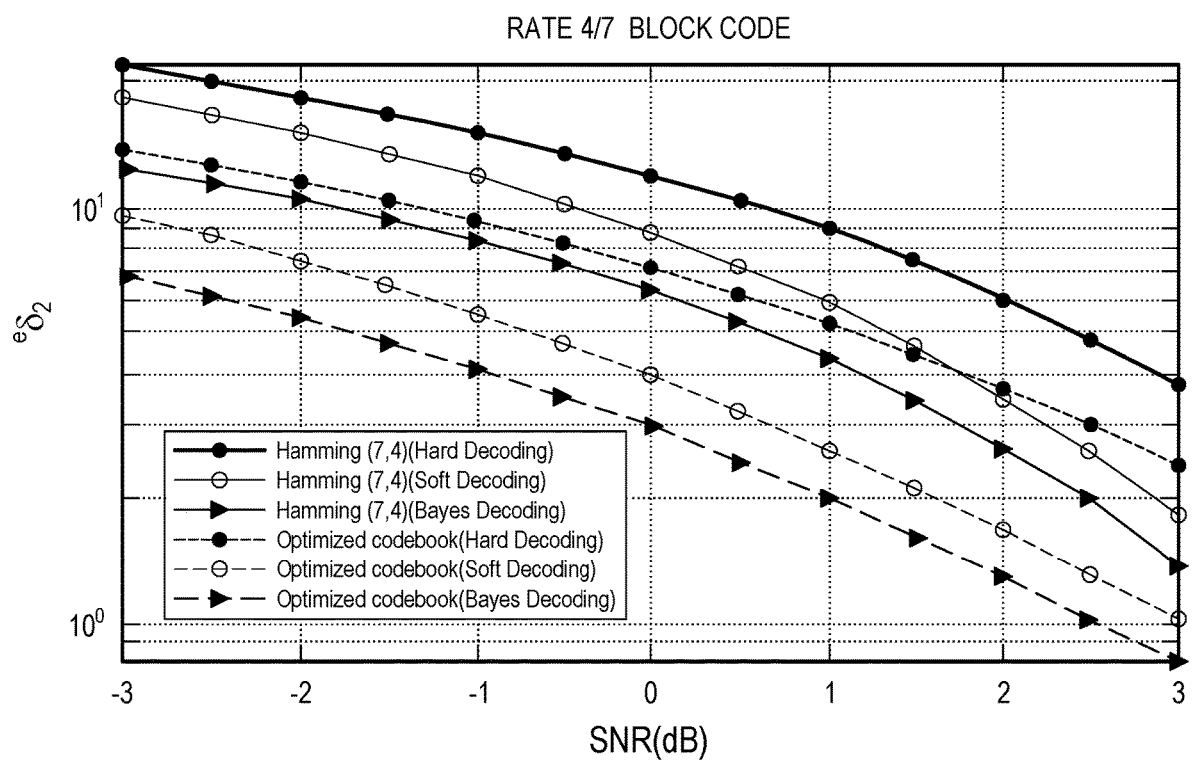

Simulating the system of FIG. 1 using $10^6$ random symbols encoded with the codebook, modulated with baseband BPSK and transmitted through an AWGN channel at various signal-to-noise ratios (SNR), from noise parameters there is estimated the variance of the noise as described above by using $10^4$ samples at the receiver. The results of $e_{\delta_1}$ and $e_{\delta_2}$ versus SNR are shown in FIGS. 7A and 7B using the respective optimized codebook and Bayes decoder optimized for SNR=0 db. FIG. 7A in particular depicts a plot 700 for $e_{\delta_1}$ versus SNR for the rate 4/7 optimized code compared with Hamming (7,4) code, and FIG. 7B in particular, depicts a plot 710 for $e_{\delta_2}$ versus SNR for the rate 4/7 optimized code compared with Hamming (7,4) code.

The following is observed in both figures: hard decoding is worse than soft decoding which is worse than Bayes decoding. In all three decoding schemes, the optimized codebook performs better than the Hamming code. For $e_{\delta_1}$, soft decoding performs almost as well as Bayes decoding. For hard decoding, the optimized codebook can be worse than the Hamming code for large SNR. This is because the codebook is tuned for a specific noise SNR, and the performance improvement over the Hamming code decreases (and can become inferior) as the SNR deviates from the tuned SNR (of 0 db in our examples). For $e_{\delta_2}$, using both an optimized codebook with Bayes decoder results in an error that is about a third smaller than Hamming (7,4) code with hard decoding.

It is further seen that the benefits of using the optimized codebook and Bayes decoding are more significant for $e_{\delta_2}$ than for $e_{\delta_1}$ error metrics.

Block Code of Rate 3/8

The same simulation as performed in connection with block code of rate 4/7 is performed with k=3 and 8-bit codewords and compared the optimized codebook with the Hadamard (8,3) code. The simulation results for $\delta_2$ have similar trends as shown in example simulation results depicted in FIG. 7B.

Block Code of Rate 8/12

The same simulation as performed in connection with a block code rate 8/12 code that maps 8-bit integers to 12-bit codewords. Simulation results comparing an optimized codebook with the modified Hamming (12, 8) code show that results for $\delta_2$ have similar trends as shown in example simulation results depicted in FIG. 7B.

Signed Integers

While embodiments herein have considered nonnegative integers represented as bitstrings, the same approach can be applied to signed integers.

Figure 9:
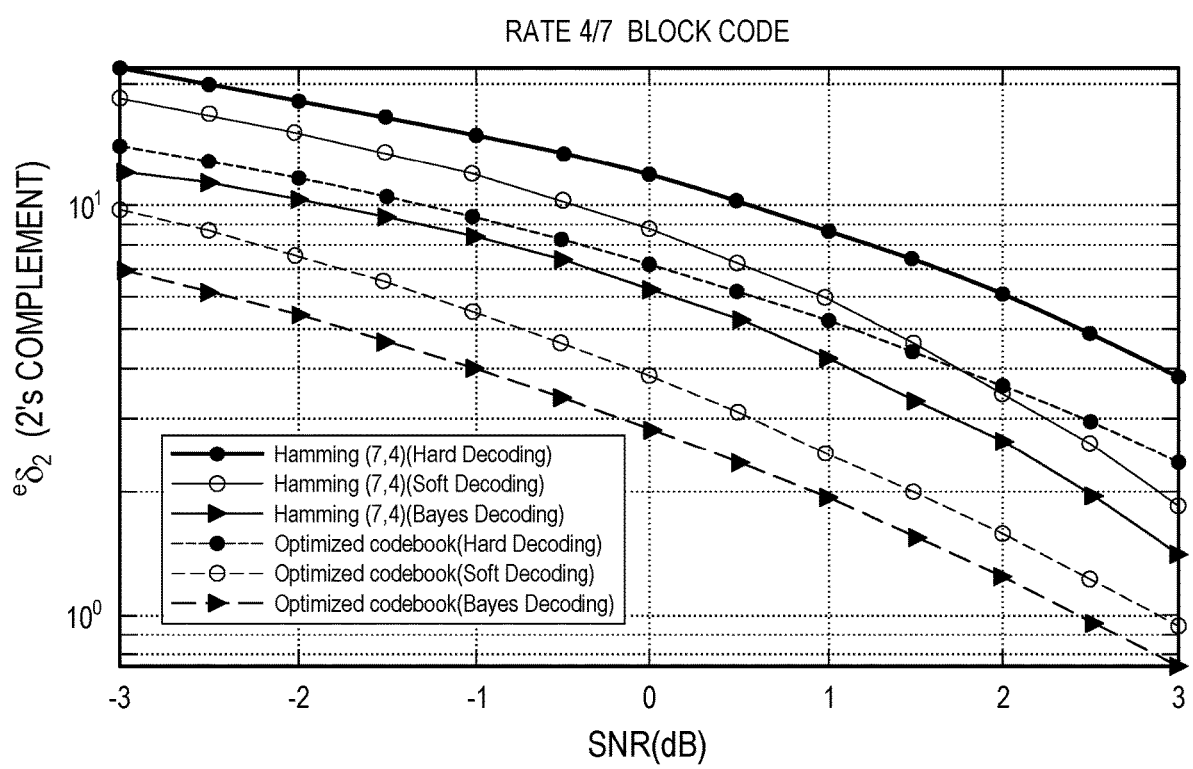
FIG. 9 depicts simulation results of a system using the respective optimized codebook and Bayes decoder optimized for SNR=0 db corresponding to respective error metrics $e_{\delta_2}$ where source symbols are represented in 2's complement format.

Considering the case of representing source symbols as signed integers (positive and negative) integers $-2^{k-1} \leq i < 2^{k-1}$ in k-bit 2's complement format, the optimal codebook may be very different. Note that in this case the Hamming distance between 0 and −1 is k. For the case k=4, rate 4/7, the optimized codebook 800 for $e_{\delta_2}$ is shown in FIG. 8 where the first, 8-th, 9-th, and last column corresponds to s=0, s=7, s=−8, and s=−1, respectively. The numerical simulation results for the 2's complement representation of source symbols are shown in FIG. 9 which are very similar trendwise to example simulation results depicted in FIG. 7B.

Thus, there is thus provided a framework for error correction coding that takes into account the difference in bit significance in the source symbols by using an appropriate error metric and minimizing it using a Bayes decoder and an optimized codebook.

It is demonstrated that the Bayes decoder performs better than standard soft and hard minimum distance decoding and that the optimized codebook performs better than classical linear block codes such as Hamming codes. The error metric based on the difference |i−j| is similar to assigning an exponential weight $2^d$ to the d-th bit.

The same approach can be applied to other ways of assigning significance to the various bits in the source bit stream by defining δ appropriately. Furthermore, the framework has considered the AWGN channel model, but the Bayes estimator can be defined and the codebook can be optimized for other channel models (such as a binary symmetric channel (BSC)) as well. In the examples above, the symbol space S has size $2^k$. This is not a necessary requirement; the optimized codebook can be built to map any number of m symbols to n-bit codewords, resulting in a rate $\log_2(m)/n$ code, thus providing a more flexible tradeoff between rate and distortion. The cases of a nonuniform prior distribution for the source symbols or the addition of source (entropy) coding result in a more complicated source symbol posterior distribution, Bayes estimator and the function v used in the heuristic. In addition, the function v can be amended to optimize for multiple noise SNR's.

Furthermore, noise models and parameters can be estimated by sending intermittent probe bits through the channel.

In further embodiments, different codebooks can be used (and the codebook choice communicated between the transmitter and the receiver) based on the noise models and/or parameters.

Figure 10:
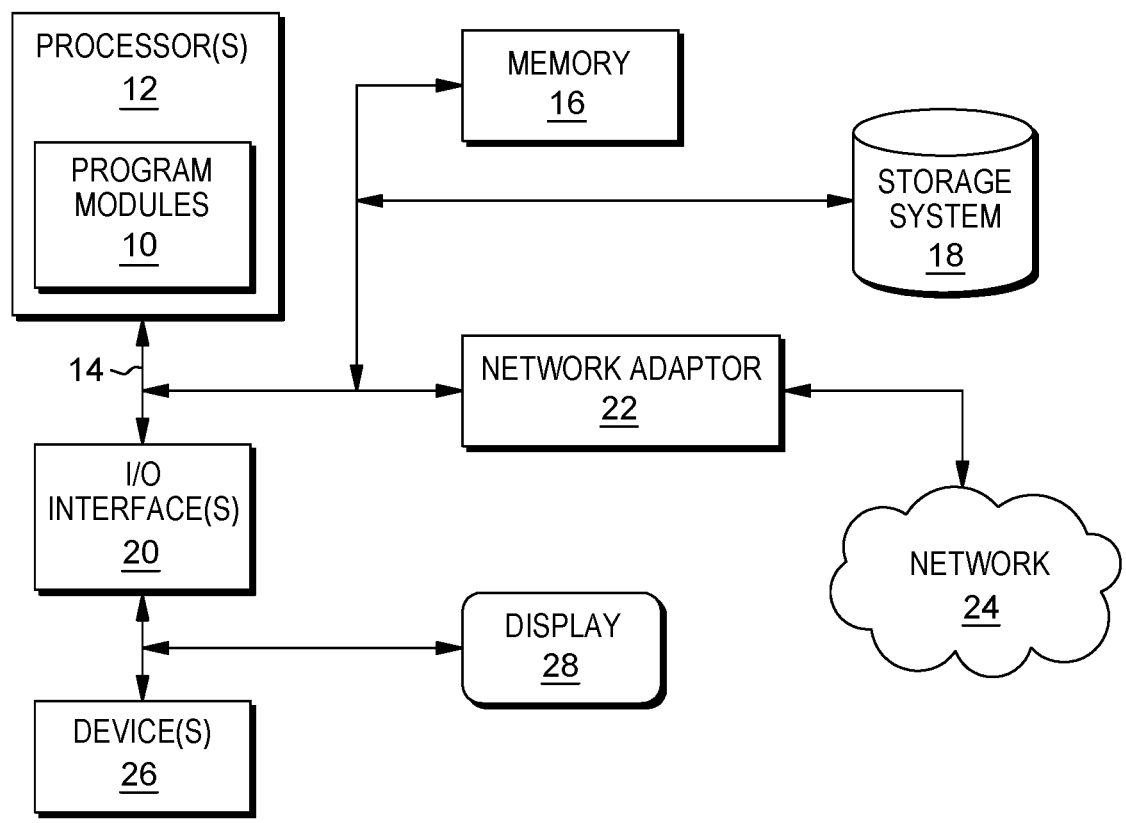
FIG. 10 illustrates an example system that may be used to generate a codebook optimized in accordance with the methods of the present invention.

FIG. 10 illustrates an example system in accordance with the present invention. The system depicted is only one example of a suitable system and is not intended to suggest any limitation as to the scope of use or functionality of embodiments of the invention. In contrast, the present invention may be operational with numerous other general purpose or special purpose computing systems, environments and/or configurations. A few examples of well-known computing systems, environments, and/or configurations that may be suitable for use with the system shown in FIG. 10 include (but are not limited to), personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The system of FIG. 10 may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

As depicted, the components of the system of FIG. 10 may include (but are not limited to), one or more processors or processing units 12, a system memory 16, and a bus 14 that operably couples various system components including system memory 16 to processor 12. The processor 12 may execute one or more modules 10 that performs methods in accordance with the present invention. The module 10 may be programmed into the integrated circuits of the processor 12, or loaded from memory 16, storage system 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate (via Input/Output (I/O) interfaces 20) with one or more external devices 26, such as a keyboard, a pointing device, a display 28, and/or one or more other devices that enable a user to interact/interface with the computer system; and/or any devices (e.g., network card, modem, network adaptor 22, etc.) that enable computer system to communicate with one or more other computing systems/devices. Such communication can occur via Input/Output (I/O) interfaces 20 and/or network adaptor 22.

By way of further example, the computer system of FIG. 10 can communicate with one or more networks 24, such as a local area network (LAN), a general wide area network (WAN), and/or a public network (e.g., the Internet) via network adapter 22. As depicted, network adapter 22 can also facilitate communication with other components of the computer system of FIG. 10 via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s).

In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An error correction method in a data symbol communication system comprising:
    receiving a signal at a decoder device, said signal an encoded codeword representing an encoded source symbol having source bits;
    decoding, at the decoding device, said encoded codeword to obtain a decoded codeword, said decoding device comprising a Bayes estimator configured to use an error metric in an information symbol space as a loss function; and
    mapping said decoded codeword to a corresponding source symbol, said encoded codeword based on an encoding of said source symbol having bits that account for differences in significance of the bits.

2. The method of claim 1, wherein said encoding of the source symbol bits comprises:
    mapping, using a codebook having codewords, said source symbol into a corresponding codeword, said codeword representing the source symbol encoded with redundancy,
    said codewords of said codebook being based on a minimized error metric, the error metric being a measure of the difference between the transmitted source symbol and the decoded source symbol as integers in the information symbol space, wherein said codebook optimizes the error metric under a channel noise characteristic.

3. The method of claim 2, wherein said decoding of the symbol source bits comprises:
    using an inverse codebook having codewords used for said decoding of the encoded symbol source bits, comprising a mapping of a decoded codeword to a corresponding source symbol.

4. The method of claim 2, wherein said error metric comprises the loss function measuring the difference between the decoded symbol and the transmitted symbol in information symbol space, said codebook being optimized with respect to the error metric in the information symbol space.

5. The method of claim 4, wherein said decoding comprises: applying the Bayes estimator to the loss function of the error metric in said information symbol space.

6. The method of claim 5, wherein the loss function comprises: an absolute value loss function, a 0-1 loss function, a squared error loss function, or a loss function that specifically weighs the bits according to their significance within the symbol.

7. The method of claim 6, wherein the Bayes estimator is implemented as one or more forms comprising: a mode, a mean or a median of a posterior distribution of the source symbol given the received codeword after transmission through the communication channel.

8. The method of claim 2, further comprising:
    running, on a processor, one of: a genetic algorithm or a hill climbing algorithm for processing an objective function to optimize said codebook codewords, said function based on the error metric and a noise characteristic of the communications channel.

9. A system for correcting error corrected encoded signals, the system comprising:
    a decoder device for receiving a signal, said signal an encoded codeword representing an encoded source symbol having source bits, said decoder processing said received signal to obtain a decoded codeword, said decoder device comprising a Bayes estimator configured to use an error metric in an information symbol space as a loss function;

a mapping device for mapping said decoded codeword to a corresponding source symbol, said encoded codeword encoded based on an encoding of source symbol having bits that account for differences in significance of the bits.

10. The system of claim 9, further comprising:

a codebook having codewords, each codeword mapping a respective source symbol into a corresponding codeword, said codeword representing the source symbol encoded with redundancy, said codewords of said codebook being based on a minimized error metric, the error metric being a measure of the difference between the transmitted source symbol and the decoded source symbol as integers in the information symbol space, wherein said codebook optimizes the error metric under a channel noise characteristic.

11. The system of claim 10, further comprising:

an inverse codebook having codewords used for said decoding of the encoded symbol source bits, comprising a mapping of a decoded codeword to a corresponding source symbol.

12. The system of claim 10, wherein said error metric comprises the loss function measuring a difference between the decoded symbol and the transmitted symbol in the information symbol space, said codebook being optimized with respect to the error metric in the information symbol space.

13. The system of claim 12, wherein said Bayes estimator is applied to the loss function of the error metric in said information symbol space.

14. The system of claim 13, wherein the loss function comprises: an absolute value loss function, a 0-1 loss function, a squared error loss function, or a loss function that specifically weighs the bits according to their significance within the symbol.

15. The system of claim 14, wherein the Bayes estimator is implemented as one or more forms comprising: a mode, a mean or a median of a posterior distribution of the source symbol given the received codeword after transmission through the communication channel.

16. The system of claim 10, further comprising:

a memory for storing instructions;

a hardware processor coupled to said memory, said processor running said instructions to configure said processor to:

run one of: a genetic algorithm or a hill climbing algorithm for processing an objective function to optimize said codebook codewords, said function based on the error metric and a noise characteristic of the communications channel.

17. A data storage system comprising a memory for receiving and storing encoded source symbols at memory locations, said encoded source symbols based on an encoding of a source symbol having bits that account for differences in significance of the bits, said encoding comprising: using a codebook having codewords, each codeword mapping a respective source symbol to be stored into a corresponding codeword, wherein to decode said encoded codeword, a processor configured as a Bayes estimator uses an error metric in an information symbol space as a loss function.

18. The data storage system of claim 17, wherein each said codeword representing the source symbol encoded with redundancy, said codewords of said codebook being based on a minimized error metric, the error metric being a measure of the difference between a transmitted source symbol and the decoded source symbol as integers in information symbol space, wherein said codebook optimizes the error metric under a channel noise characteristic; and said data storage system further comprising:

an inverse codebook having codewords used for said decoding of the encoded symbol source bits, comprising a mapping of a decoded codeword to a corresponding source symbol.

19. The data storage system of claim 18, wherein said error metric comprises a loss function measuring the difference between the decoded symbol and the transmitted symbol in information symbol space, said codebook being optimized with respect to the error metric in the information symbol space, wherein said Bayes estimator is applied to the loss function of the error metric in said information symbol space.

20. The data storage system of claim 19, wherein the loss function comprises: an absolute value loss function, a 0-1 loss function, a squared error loss function, or a loss function that specifically weighs the bits according to their significance within the symbol; and the Bayes estimator is implemented as one or more forms comprising: a mode, a mean or a median of a posterior distribution of the source symbol given the received codeword after transmission through of the communication channel.

* * * * *